United States Patent [19]

Nakajima et al.

[11] Patent Number: 5,072,191

[45] Date of Patent: Dec. 10, 1991

[54] HIGH-VOLTAGE PULSE GENERATING CIRCUIT, AND DISCHARGE-EXCITED LASER AND ACCELERATOR CONTAINING SUCH CIRCUIT

[75] Inventors: Shin Nakajima; Osamu Shimoe; Rihito Kagawa, all of Kumagaya, Japan

[73] Assignee: Hitachi Metals, Ltd., Tokyo, Japan

[21] Appl. No.: 500,392

[22] Filed: Mar. 28, 1990

[30] Foreign Application Priority Data

Mar. 30, 1989 [JP] Japan .................................. 1-79840

[51] Int. Cl.$^5$ .......................... H03K 3/01; H03K 3/30; H03L 5/00; H01S 3/10
[52] U.S. Cl. ...................................... 328/65; 307/264; 307/314; 307/282; 372/25; 372/38
[58] Field of Search .................... 328/65, 74; 307/260, 307/264, 314, 282; 372/25, 38; 156/82

[56] References Cited

U.S. PATENT DOCUMENTS

| 4,549,091 | 10/1985 | Fahlen et al. | 307/106 |
| 4,602,166 | 7/1986 | Smith | 307/314 |
| 4,724,020 | 2/1988 | Ebata et al. | 156/82 |
| 4,730,166 | 3/1988 | Birx et al. | 328/233 |

FOREIGN PATENT DOCUMENTS 63-171172  7/1988  Japan .

OTHER PUBLICATIONS

"The Use of Saturable Reactors as Discharge Devices for Pulse Generators" by W. Melville, Proceedings of IEE, vol. 98, Part 3, No. 53, pp. 185-207, 1951.
"Electrical Excitation of an XeCl Laser Using Magnetic Pulse Compression" by Smilanski et al., Appl. Phys. Lett 40(7), Apr. 1, 1982, pp. 547-548.
"An Efficient Laser Pulser Using Ferrite Magnetic Switches" by Baker et al. J. Phys. E. Sci. Instrument 21, pp. 218-224 (1988).
"The Application of Magnetic Switches as Pulse Sources for Induction Linacs" by Birx et al., IEEE Trans. on Nuclear Science, vol. NS-30, No. 4, pp. 2763-2768, Aug. 1983.
Abridged Translation of Japanese Patent Laid-Open No. 63-171172, Laid Open Jul. 14, 1988.

Primary Examiner—Stanley D. Miller
Assistant Examiner—Trong Phan
Attorney, Agent, or Firm—Finnegan, Henderson, Farabow, Garrett & Dunner

[57] ABSTRACT

A high-voltage pulse generating circuit comprising a magnetic pulse compression circuit having a saturable reactor, and a variable inductor provided on the input side of the saturable reactor for controlling a pulse width of voltage pulse to be applied to the saturable reactor. This circuit may be used in discharge-excited lasers such as excimer lasers and accelerators such as linear induction accelerators.

6 Claims, 10 Drawing Sheets $\tau_{s1}$ $\tau_1$ $\tau_{s1} + \tau_2$

○ : PRESENT INVENTION
△ : CONVENTIONAL CIRCUIT

NUMBER OF SHOTS ($\times 10^4$)

HIGH-VOLTAGE PULSE GENERATING CIRCUIT, AND DISCHARGE-EXCITED LASER AND ACCELERATOR CONTAINING SUCH CIRCUIT

BACKGROUND OF THE INVENTION

The present invention relates to a high-voltage pulse generating circuit for use in discharge-excited lasers such as copper vapor lasers, excimer lasers, etc. and accelerators such as linear induction accelerators, and more particularly to a high-voltage pulse generating circuit comprising a magnetic pulse compression circuit.

Discharge-excited lasers such as copper vapor lasers, excimer lasers, etc. are expected to be used for uranium enrichment, lithography, etc.

Such discharge-excited lasers are required to have large output, high pulse-repetition rate, high reliability and long service life. For achieving these requirements, a high-voltage pulse generating circuit as shown in FIG. 4 is used. This high-voltage pulse generating circuit comprises a variable high-voltage dc power supply 1, a resistor 2 for charging a main capacitor 5, a thyratron 3, an inductor 4, a capacitor 6, main laser discharge electrodes 7, a saturable reactor 8, an inductor 9 for charging the main capacitor 5, a peaking capacitor 10, an output winding 11 of the saturable reactor 8, a reset winding 12 for the saturable reactor 8, and a reset circuit 14 for the saturable reactor 8. The reset circuit 14 has output terminals 15, 16 connected to the terminals of the reset winding 12 of the saturable reactor 8.

Explanation will be made referring to FIGS. 4, 9 and 10 on the operation of this circuit when parameters of the constituent elements are optimized such that an energy transmission efficiency from the main capacitor 5 to the peaking capacitor 10 is maximum.

Incidentally, in the circuit shown in FIG. 4, the reset circuit 14 of the saturable reactor 8 has a structure shown in FIG. 5. In FIG. 5, 17 denotes a dc power supply, 18 a resistor, and 19 an inductor for absorbing surge voltage.

In the turn-off period of the thyratron 3, the saturable reactor 8 is reset from a point "e" to a point "a" in FIG. 9, by a magnetizing force Hr generated by current for charging the main capacitor 5 which flows through a course from a positive electrode of the dc power supply 1 to the resistor 2, the inductor 4, the main capacitor 5, the output winding 11 of the saturable reactor 8, the inductor 9 and a negative electrode of the dc power supply 1, and a reset current Ic which flows from the reset circuit 14 to the reset winding 12 of the saturable reactor 8.

Next, when the thyratron 3 is turned on at t=0 in FIG. 10, terminal voltage $v_6$ of the capacitor 6 increases, as shown in FIG. 10(a), in the polarity shown in FIG. 4, by discharge current $i_1$ shown in FIG. 10(b) which flows through a course from a positive electrode of the main capacitor 5, to the inductor 4, the thyratron 3, the capacitor 6 and a negative electrode of the main capacitor 5. During this period, the magnetic flux density of the saturable reactor 8 changes from a point "a" toward a point "b" in FIG. 9. At this time, since the output winding 11 of the saturable reactor 8 has an extremely large inductance $L_{11}$ (unsat.), current $i_2$ flowing through a course from the capacitor 6 to the capacitor 10, the output winding 11 of the saturable reactor 8 and the capacitor 6 is extremely smaller than the current $i_1$ as shown in FIG. 10(e). Thus, the saturable reactor 8 is in a turn-off state equivalently. Therefore, as shown in FIG. 10(c), the output winding 11 of the saturable reactor 8 blocks the voltage at a polarity shown in FIG. 4.

When the current $i_1$ becomes zero at $t=\tau_1$, the magnetic flux density of the saturable reactor 8 reaches a point "b" in FIG. 9, so that a magnetic core of the saturable reactor 8 is saturated. At this time, the output winding 11 of the saturable reactor 8 has inductance $L_{11}$ (sat.) sufficiently smaller than the inductance of the inductor 4, so that most of charges stored in the capacitor 6 flow as current $i_2$ in the direction shown in FIG. 4. As shown in FIG. 10(e), $i_2$ drastically increases, so that the magnetic flux density of the saturable reactor 8 changes from a point "b" to a point "Br" via a point "c" in FIG. 9. Accordingly, energy stored in the capacitor 6 is mostly transmitted to the peaking capacitor 10 as shown in FIG. 10(d).

Incidentally, a period from the turn-on of the thyratron 3 and to a time at which the current $i_2$ becomes zero is called "gate period." Assuming that each element suffers from no loss, $$\int_0^{\tau_1} v_6 \cdot dt \simeq \frac{E \cdot \tau_1}{2} \tag{1}$$

$$\int_0^{\tau_1} v_{11} \cdot dt = N_{11} \cdot Ae \cdot \Delta B_m \tag{2}$$

Assuming $v_6 \simeq v_{11}$, $$\frac{E \cdot \tau_1}{2} \simeq N_{11} \cdot Ae \cdot \Delta B_m \tag{3}$$

$$\Delta B_m \simeq B_s - (-B_r) \tag{4}$$

$$\tau_1 \simeq \pi \sqrt{\frac{L_4 \cdot C_5 \cdot C_6}{C_5 + C_6}} \tag{5}$$

$$\tau_2 \simeq \pi \sqrt{\frac{L_{11(sat)} \cdot C_6 \cdot C_{10}}{C_6 + C_{10}}} \tag{6}$$

$$H_{LM} = \frac{N_{11} \cdot I_{2m}}{le} \tag{7}$$

E: Input dc power supply voltage (V).
$N_{11}$: Number of winding of output winding 11 of saturable reactor 8.
Ae: Effective cross section (m²) of saturable reactor 8.
$\Delta B_m$: Operating magnetic flux density (T) of saturable reactor 8.
Bs: Saturation magnetic flux density (T) of saturable reactor 8.
Br: Residual magnetic flux density (T) of saturable reactor 8.
$L_4$: Inductance (H) of inductor 4.
$L_{11(sat)}$: Inductance (H) of output winding 11 of saturable reactor 8.
$C_5$: Capacitance (F) of main capacitor 5.
$C_6$: Capacitance (F) of capacitor 6.
$C_{10}$: Capacitance (F) of peaking capacitor 10.
$H_{LM}$: Gate magnetizing force of saturable reactor 8.
$I_{2m}$: Wave height (A) of $i_2$.
le: Mean magnetic path length (m) of saturable reactor 8.

As soon as all the energy of the capacitor 6 is transmitted to the peaking capacitor 10, the main laser discharge electrodes 7 are broken down at a time of $\tau_1+\tau_2$ as shown in FIG. 10, so that the energy of the peaking capacitor 10 is consumed in a laser gas. At this time, although most energy accumulated in the peaking capacitor 10 is consumed in a laser gas via the main laser discharge electrodes 7, a part of the energy is used to reset the saturable reactor 8. By this energy, the magnetic flux density of the saturable reactor 8 changes from a point "Br" to a point "e" via a point "d" in FIG. 9.

The above operation is usually repeated at a predetermined pulse-repetition rate.

Incidentally, the reset circuit 14 functions to reset the saturable reactor 8 to a magnetic flux density smaller than Br, even when the current discharged from the main capacitor 5 is smaller than current necessary for generating a full-reset magnetizing force Hr of the magnetic core of the saturable reactor 8. The details of the reset circuit are described in Japanese Patent Laid-Open No. 63-171172, etc.

In the above conventional circuit, there is one magnetic pulse compression circuit comprising a saturable reactor, but some high-voltage pulse generating circuits comprise multistage magnetic pulse compression circuits consisting of a plurality of magnetic pulse compression circuits each comprising a saturable reactor. Also, in the case of accelerators such as linear induction accelerators, high-voltage pulse generating circuits comprising multistage magnetic pulse compression circuits are mostly used because large output is required.

Incidentally, the principle of a magnetic pulse compression circuit is described in "The Use of Saturable Reactors As Discharge Devices for Pulse Generators," W. S. Melville, Proceedings of Institute of Electrical Engineers, (London) Vol. 98, Part 3, No. 53, pp. 185-207 (1951); the application of such circuit to discharge-excited lasers is described in "Electrical Excitation of an XeCl Laser Using Magnetic Pulse Compression," I. Smilanski, S. R. Byron and T. R. Burkes, Appl. Phys. Lett. 40 (7), pp. 547-548 (1982); the magnetic pulse compression circuit using semiconductor elements is described in U.S. Pat. No. 4,549,091, and "An Efficient Laser Pulser Using Ferrite Magnetic Switches," H. J. Baker, P. A. Ellsmore and E. C. Sille, J. Phys. E. Sci. Instrument 21 (1988), pp. 218-224.

Also, in accelerators such as linear induction accelerators for free electron lasers, etc., high-voltage pulse generating circuits having the same system as described above may be used. The details are described, for instance, in D. Birx, E. Cook, S. Hawkins, S. Poor, L. Reginato, J. Schmidt and M. Smith: "The Application of Magnetic Switches as Pulse Sources for Induction Linacs", IEEE Transactions on Nuclear Science, Vol. NS-30, No. 4, pp. 2763-2768 (1983), and U.S. Pat. No. 4,730,166.

In discharge-excited lasers, the stabilization of laser output and the reduction of jitter are required. For instance, in excimer lasers for lithography, it is necessary to stably supply a laser output of about 100 mJ per one pulse for a period of $10^8$ shots or more in a pulserepetition rate of about 500 Hz. However, since a laser gas is deteriorated by repeated operation, it is necessary to gradually increase an energy to be supplied to the laser gas, in order to satisfy the above output requirements. For this purpose, in the conventional circuit shown in FIG. 4, the input dc power supply voltage is gradually increased. In the circuit shown in FIG. 4, since the operating magnetic flux density ($\Delta B_m$ expressed by the formula (4)) of the saturable reactor 8 in a gate period is constant, voltage and current at main elements in the circuit have waveforms shown in FIG. 11, when the input dc power supply voltage is lower than an optimum value at which the energy transmission efficiency from the main capacitor 5 to the peaking capacitor 10 is maximum. On the other hand, when the input dc power supply voltage is higher than the above optimum value, the voltage and current waveforms become as shown in FIG. 12. In both cases, the energy transmission efficiency from the main capacitor 5 to the peaking capacitor 10 decreases, and after-current of the current $i_1$ flowing between main electrodes of the thyratron 3 increases, causing inverse current to flow. As a result, the loss of the thyratron 3 increases. Further, since a percentage of energy which does not contribute to the laser oscillation increases in the laser gas, the service life of the laser gas decreases. Therefore, the number of shots by which a constant laser output can be obtained is limited to $10^6$ or so.

In the copper vapor lasers used in a uranium enrichment process, stable, continuous operation is required at a pulse-repetition rate of about 5 kHz or more and at a laser output of about 100 W with a jitter of ±3 nanoseconds or less for about 1000 hours or more. Since such lasers are operated at a pulse-repetition rate about one order higher than that of the excimer laser, it is strongly desired to use a high-voltage pulse generating circuit comprising a multistage magnetic pulse compression circuit and semiconductor elements such as thyristors instead of thyratrons as switching elements. However, in the conventional high-voltage pulse generating circuit utilizing a multistage magnetic pulse compression circuit, to optimize the energy transmission efficiency from the main capacitor to the peaking capacitor at a final stage, inductance in each magnetic pulse compression circuit should be adjusted. For this purpose, an inductor is inserted in series to a saturable reactor in each magnetic pulse compression circuit to measure a pulse width of current flowing after the saturation of the saturable reactor, and then an inductor having a different inductance is inserted in series to the saturable reactor. This is because the operating magnetic flux density of the saturable reactor constituting each magnetic pulse compression circuit in a gate period is constant as $\Delta B_m$ in the above formula (4). In addition, the above procedure should be utilized in the adjustment of the magnetic pulse compression circuit in the synchronous operation of a plurality of high-voltage pulse generating circuits, so that it is extremely difficult to use such system in commercial plants needing the synchronous operation of a plurality of high-voltage pulse generating circuits.

In free electron lasers or linear induction accelerators used for plasma heating of nuclear fusion plants, a kind of transformer for accelerating electron beams, which is called "accelerator cell," should be supplied with rectangular pulses having a voltage wave height of several hundreds of kV, a current wave height of several tens of kA and a pulse width of about 100 nanoseconds, with jitter within several nanoseconds at a pulse-repetition rate of several kHz or more in a burst mode for as long a period of time as possible. In the high-voltage pulse generating circuit in these applications, a multistage magnetic pulse compression circuit comprising thyratrons as switching elements in parallel is used. In this high-voltage pulse generating circuit, there is a problem that the energy transmission efficiency decreases as the operation time passes, since the operating magnetic flux density of the magnetic core of the saturable reactor in a gate period decreases by repeated operation because of temperature rise caused by the loss of the saturable reactor.

OBJECTS AND SUMMARY OF THE INVENTION

Accordingly, an object of the present invention is to provide a high-voltage pulse generating circuit capable of being operated at a high pulse-repetition rate with high reliability without suffering from the decrease in energy transmission efficiency, the increase in switching element loss and the generation of output jitter even when the variation of characteristics of each element such as input power supply voltage variation, load variation, etc. takes place.

Another object of the present invention is to provide a discharge-excited laser comprising such a high-voltage pulse generating circuit.

A further object of the present invention is to provide an accelerator comprising such a high-voltage pulse generating circuit.

Thus, the high-voltage pulse generating circuit according to the present invention comprises a magnetic pulse compression circuit having a saturable reactor, and a variable inductor provided on the input side of the saturable reactor for controlling a pulse width of voltage pulse to be applied to the saturable reactor.

The discharge-excited laser according to the present invention comprises a high-voltage pulse generating circuit which comprises a magnetic pulse compression circuit having a saturable reactor and a variable inductor provided on the input side of the saturable reactor for controlling a pulse width of voltage pulse to be applied to the saturable reactor.

The accelerator according to the present invention comprises a high-voltage pulse generating circuit which comprises a magnetic pulse compression circuit having a saturable reactor and a variable inductor provided on the input side of the saturable reactor for controlling a pulse width of voltage pulse to be applied to the saturable reactor.

BRIEF DESCRIPTION OF THE DRAWINGS

FIG. 13 (b) is a graph showing the relation between laser output and number of shots;

FIG. 13 (c) is a graph showing the relation between energy transmission efficiency and number of shots; and FIG. 13 (d) is a graph showing the relation between input voltage and number of shots.

DETAILED DESCRIPTION OF THE INVENTION

In the high-voltage pulse generating circuit of the present invention, even when the input voltage pulse-blocking period $\tau_{s1}$ of the saturable reactor becomes shorter than an optimum period $\tau_1$ in which the energy transmission efficiency is maximum by increasing the input dc power supply voltage, the input voltage pulse-blocking period $\tau_{s1}$ is kept equal to the optimum period $\tau_1$ by decreasing the inductance of a variable inductor to a proper value.

In the high-voltage pulse generating circuit of the present invention, there may be provided a controlling means for changing the variable inductor depending on the input dc power supply voltage supplied to the high-voltage pulse generating circuit.

By this circuit structure, even though the input dc power supply voltage is changed, the energy transmission efficiency is always kept optimum, and the main switching elements are operated stably.

In the case of a discharge-excited laser, since a laser gas is gradually deteriorated, energy supplied to the laser gas should be increased to keep the laser output constant. As a practical matter, the input dc power supply voltage should be increased as the laser gas is deteriorated. Accordingly, in the discharge-excited laser comprising a high-voltage pulse generating circuit comprising a magnetic pulse compression circuit having a saturable reactor, there is desirably a controlling means for changing the inductance of the variable inductor to control the width of the voltage pulse applied to the saturable reactor depending on the input dc power supply voltage.

Also in the case of an accelerator comprising a high-voltage pulse generating circuit comprising a magnetic pulse compression circuit having a saturable reactor, such as a linear induction accelerator, it is important to utilize energy efficiently, and for this purpose, it is necessary to prevent the decrease in energy transmission efficiency, which is caused by the decrease in the operating magnetic flux density of a magnetic core due to the heat generation of the saturable reactor. Accordingly, the accelerator desirably comprises a controlling means for changing the inductance of the variable inductor which controls the width of the voltage pulse applied to the saturable reactor, depending on the decrease in the operating magnetic flux density of the magnetic core of the saturable reactor.

The present invention will be further described in detail referring to the attached drawings.

Figure 1:
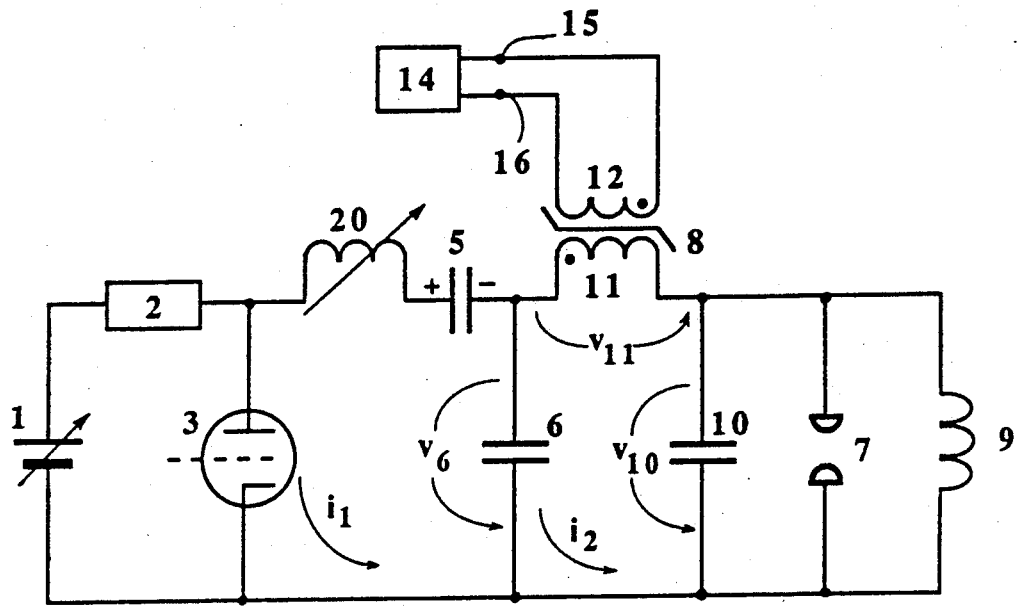
FIG. 1 is a schematic view showing the high-voltage pulse generating circuit according to one embodiment of the present invention.

FIG. 1 shows a circuit according to one embodiment of the present invention. This circuit comprises a variable inductor 20 instead of an inductor 4 in FIG. 4 on the input side of a main capacitor 5. With respect to other elements, the circuit of FIG. 1 is essentially identical to that of FIG. 4.

Figure 7A:
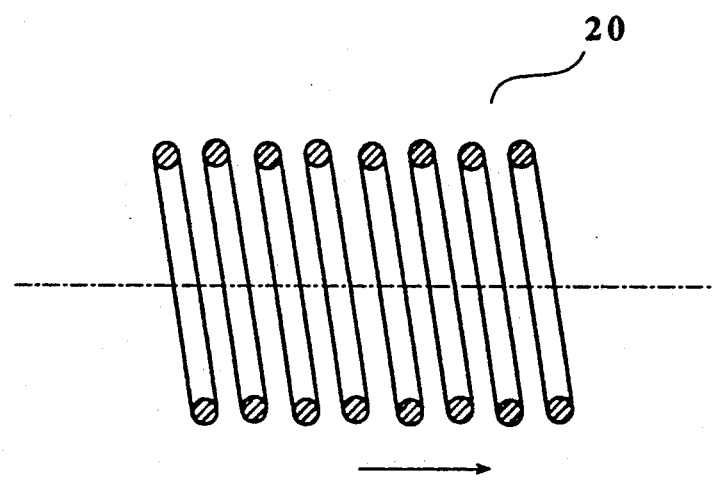
FIGS. 7a and 7b are schematic views showing a variable inductor used in the high-voltage pulse generating circuit shown in FIGS. 1 and 2.
Figure 7B:
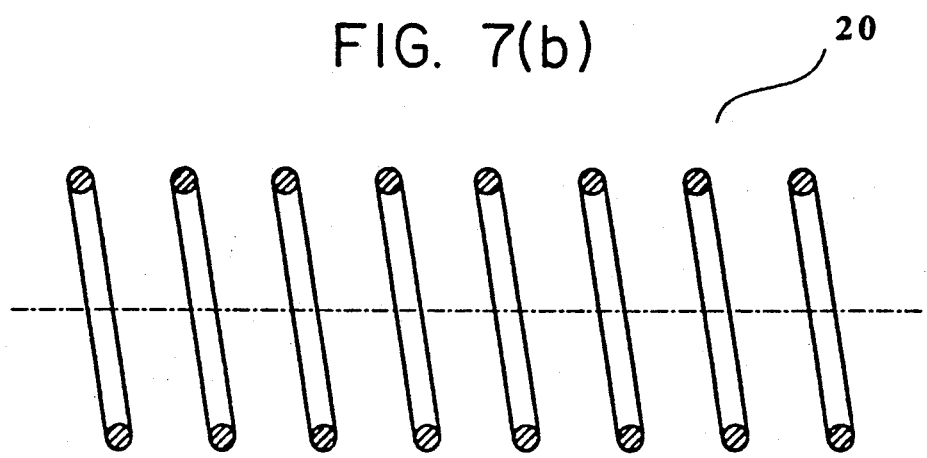

A typical example of this variable inductor 20 is a solenoid-type inductor having a cross section shown in FIG. 7. The solenoid-type variable inductor 20 can be expanded from a state shown in FIG. 7(a) to a state shown in FIG. 7(b) in the direction shown by the arrow, thereby decreasing an inductance. The longitudinal length of the coil 20 is variable depending upon the input voltage such that the saturable reactor 8 is saturated at a time when the energy supplied to the peaking capacitor 10 is maximum. In the high-voltage pulse generating circuit of FIG. 1, voltage and current waveforms are as shown in FIG. 10 in each element.

Incidentally, the input voltage may be changed such that the laser output is kept constant, thereby controlling the inductance of the variable inductor 20.

Figure 4:
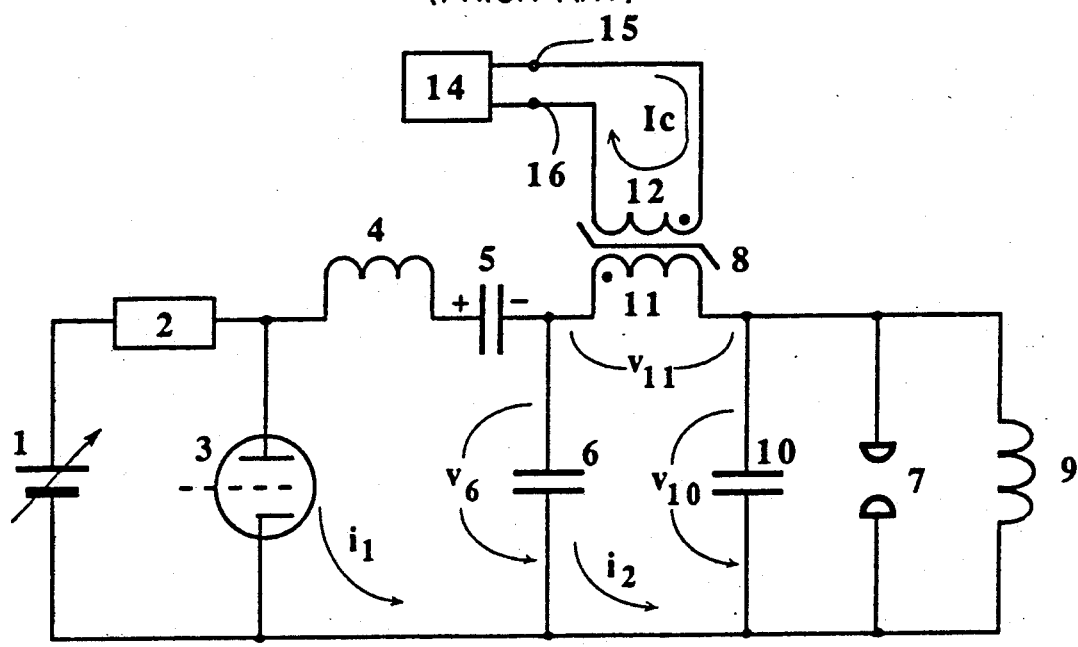
FIG. 4 is a schematic view showing a conventional high-voltage pulse generating circuit.
Figure 5:
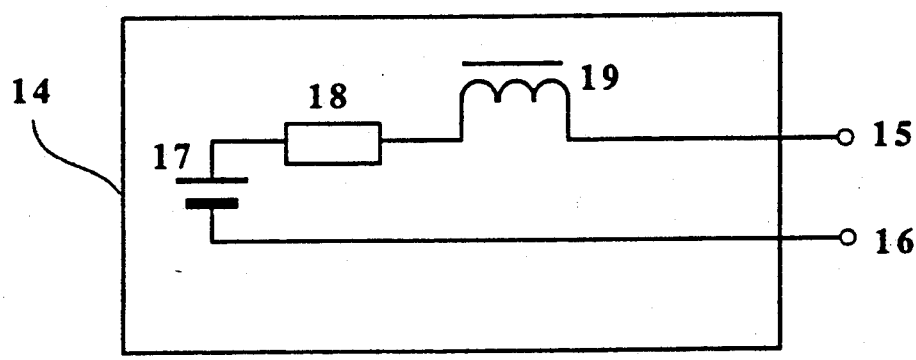
FIG. 5 is a schematic view showing a reset circuit used in the high-voltage pulse generating circuit shown in FIGS. 1-4.

FIG. 13 shows the characteristics of the high-voltage pulse generating circuit shown in FIG. 1 and the conventional high-voltage pulse generating circuit shown in FIG. 4, both when used in a KrF excimer laser.

In both cases, each of the main capacitor 5, the capacitor 6 and the peaking capacitor 10 has a capacitance of 20 nF, the main laser discharge electrodes 7 have an effective distance of 500 mm, and a magnetic core of the saturable reactor 8 is constituted by six wound cores (155 mm$\phi \times$ 60 mm$\phi \times$ 25 mm) stacked together, each composed of a Co-base amorphous alloy ribbon and an interlaminar insulating film made of polyethylene terephthalate. The saturable reactor 8 has an operating magnetic flux density of 1.1 T, and a pulse-repetition rate of 300 Hz.

As shown in FIGS. 13(a)-(d), the high-voltage pulse generating circuit of the present invention is better than the conventional high-voltage pulse generating circuit of FIG. 4 in laser output stability and energy transmission efficiency.

Figure 2:
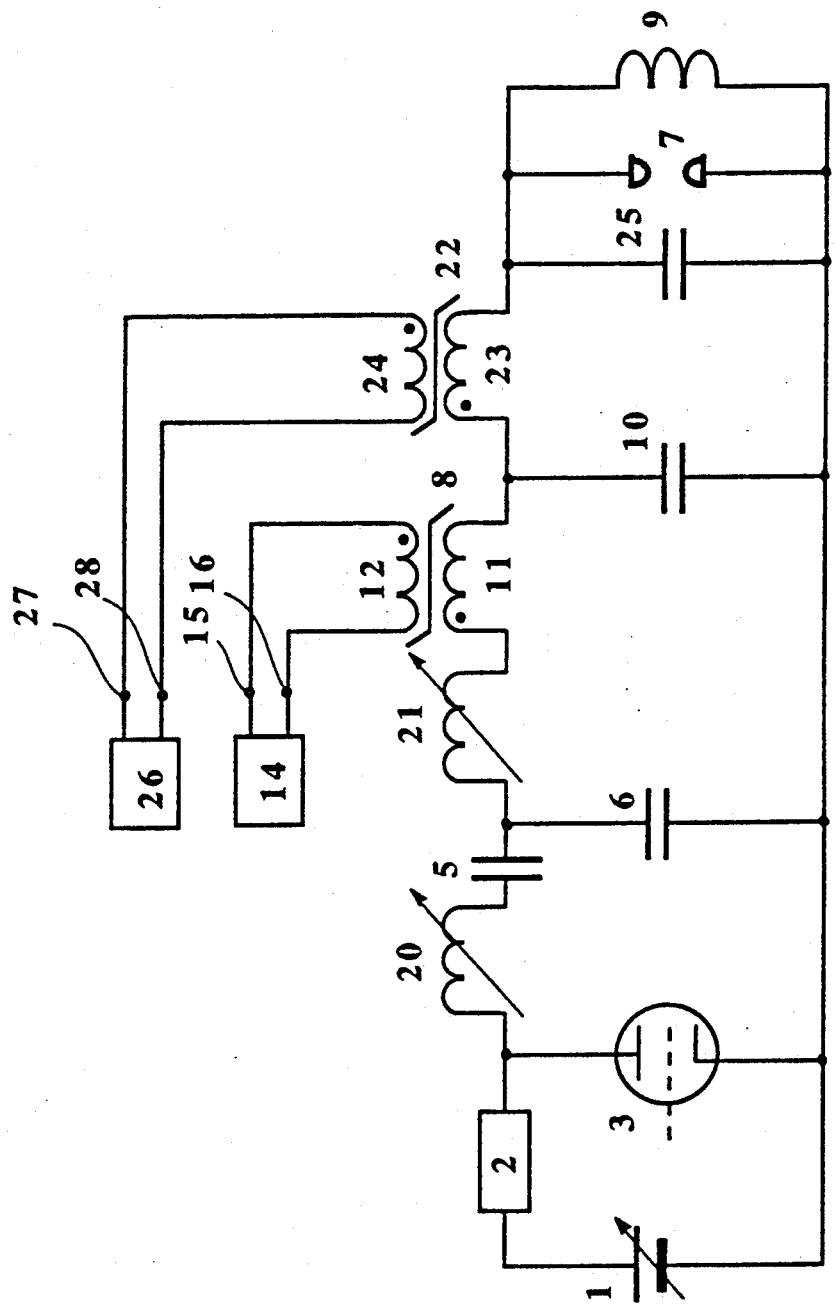
FIG. 2 is a schematic view showing the high-voltage pulse generating circuit according to another embodiment of the present invention.

FIG. 2 shows a high-voltage pulse generating circuit comprising a multistage magnetic pulse compression circuit according to another embodiment of the present invention. This high-voltage pulse generating circuit comprising two-stage magnetic pulse compression circuits may be used for a discharge-excited laser.

Figure 6:
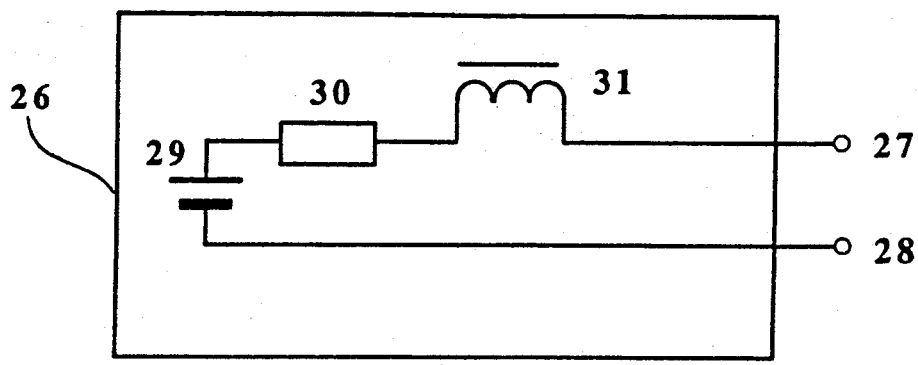
FIG. 6 is a schematic view showing a reset circuit used in the high-voltage pulse generating circuit shown in FIG. 2.

This circuit comprises, in addition to the elements shown in FIG. 1, a second variable inductor 21, a second saturable reactor 22 having an output winding 23 and a reset winding 24, a peaking capacitor 25, a reset circuit 26 for the second saturable reactor 22, which has terminals 27, 28 connected to the reset winding 24. The reset circuit 26 has a circuit structure shown in FIG. 6, which comprises a dc power supply 29, a resistor 30 and an inductor 31 for absorbing surge voltage.

This circuit comprises two variable inductors 20, 21 each having a solenoidal structure shown in FIG. 7, on the input side of the main capacitor 5 and on the input side of the saturable reactor 11 constituting the first magnetic pulse compression circuit, respectively.

In this circuit, the timing of saturating the saturable reactor 8 and the timing of saturating the saturable reactor 22 are determined such that energy supplied to the final stage peaking capacitor 25 becomes maximum by changing inductance of each variable inductor 20, 21 depending on the variation of the input voltage.

The circuit of this embodiment is also excellent in laser output stability and energy transmission efficiency as compared with a discharge-excited laser comprising the conventional high-voltage pulse generating circuit.

Figure 3:
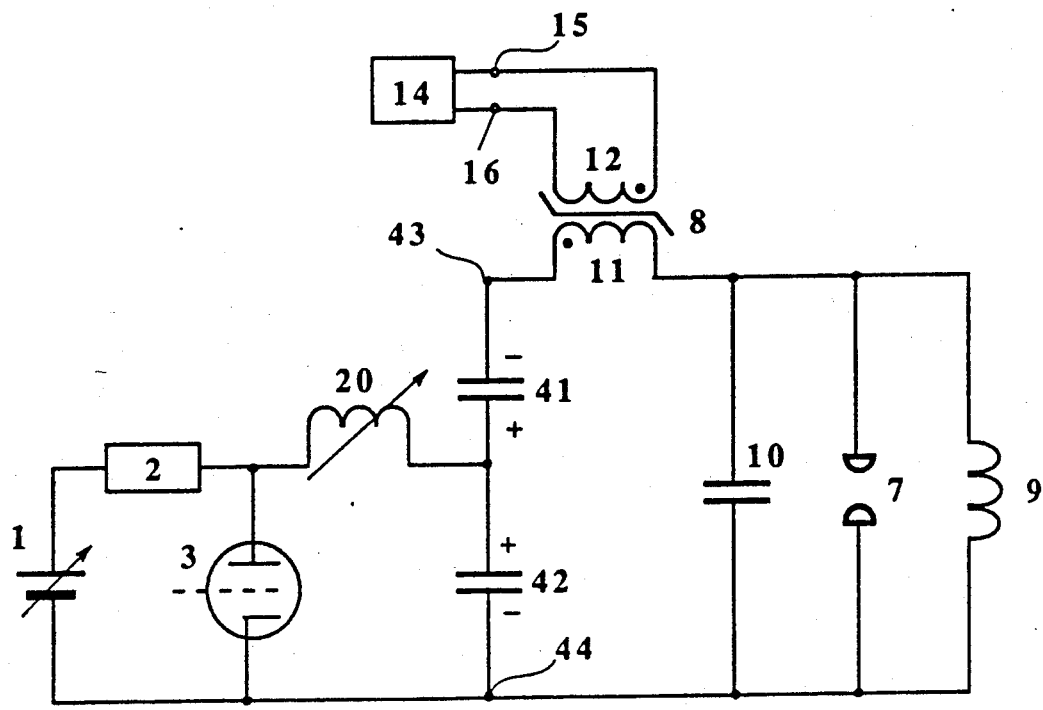
FIG. 3 is a schematic view showing the high-voltage pulse generating circuit according to a further embodiment of the present invention.

FIG. 3 shows a high-voltage pulse generating circuit according a further embodiment of the present invention. This high-voltage pulse generating circuit comprises a voltage doubler circuit (LC inversion circuit) in addition to the magnetic pulse compression circuit, and it may also be used for a discharge-excited laser. In this circuit, 41 denotes a first main capacitor, 42 a second main capacitor, and other elements are the same as in FIG. 1.

In this circuit, in a turn-off period of the thyratron 3, charges are stored in the first main capacitor 41 and the second main capacitor 42 in polarities as shown in FIG. 3. When the thyratron 3 is turned on, the charges stored in the second main capacitor 42 flow through a course from a positive electrode of the second main capacitor 42 to a variable inductor 20, the thyratron 3 and a negative electrode of the second main capacitor 42, so that the polarity of the second main capacitor 42 is inverted. On the other hand, the charges stored in the first main capacitor 41, which if otherwise would flow through a course from a positive electrode of the first main capacitor 41 to the variable inductor 20, the thyratron 3, the capacitor 10, the output winding 11 of the saturable reactor 8 and a negative electrode of the first main capacitor 41, are not substantially discharged because the output winding 11 has an extremely large inductance $L_{11}$, meaning that it is equivalently in a state of switch off. Accordingly, in a period until when the saturable reactor 8 becomes saturated after the turn-off of the thyratron 3, voltage is generated with its negative polarity directed to the first and second main capacitors 41, 42 and its positive polarity directed to a point 44. When the inductance of the variable inductor 20 is optimized such that the saturable reactor 8 is saturated just at a time when the charges stored in a polarity shown in FIG. 3 in the second main capacitor 42 in a turn-off period of the thyratron 3 are completely inverted after the turn-on of the thyratron 3, voltage about double as large as the input voltage can be generated between 43 and 44, assuming that there is no loss in each element. Thus, the energy transmission efficiency to the peaking capacitor 10 is maximum.

Figure 8A:
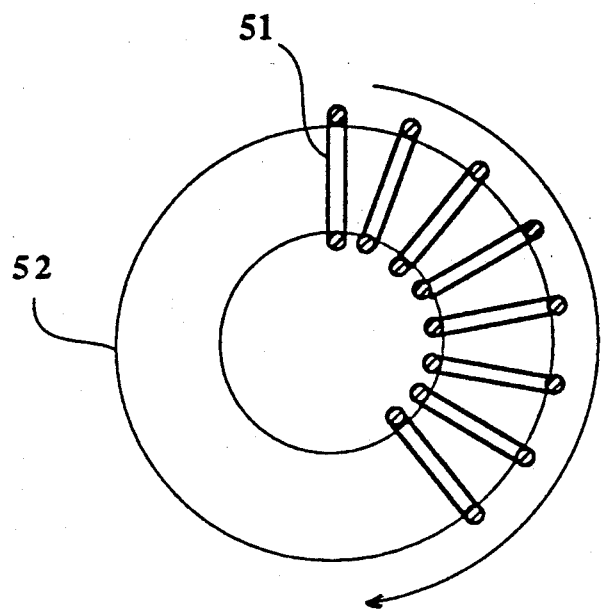
FIGS. 8a and 8b are schematic views showing a variable inductor used in the high-voltage pulse generating circuit shown in FIG. 3.
Figure 8B:
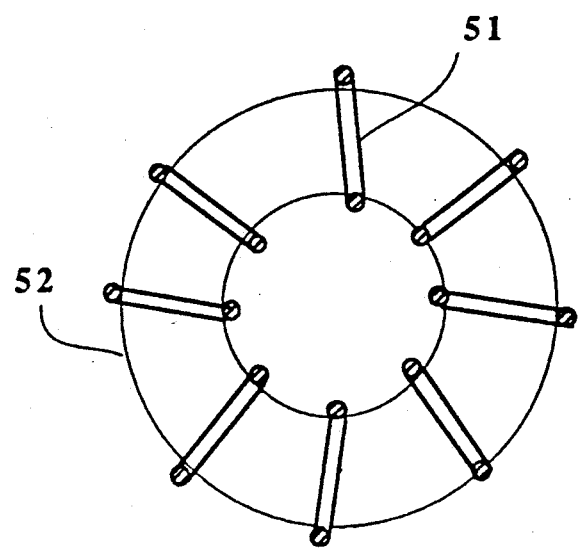
Figure 9:
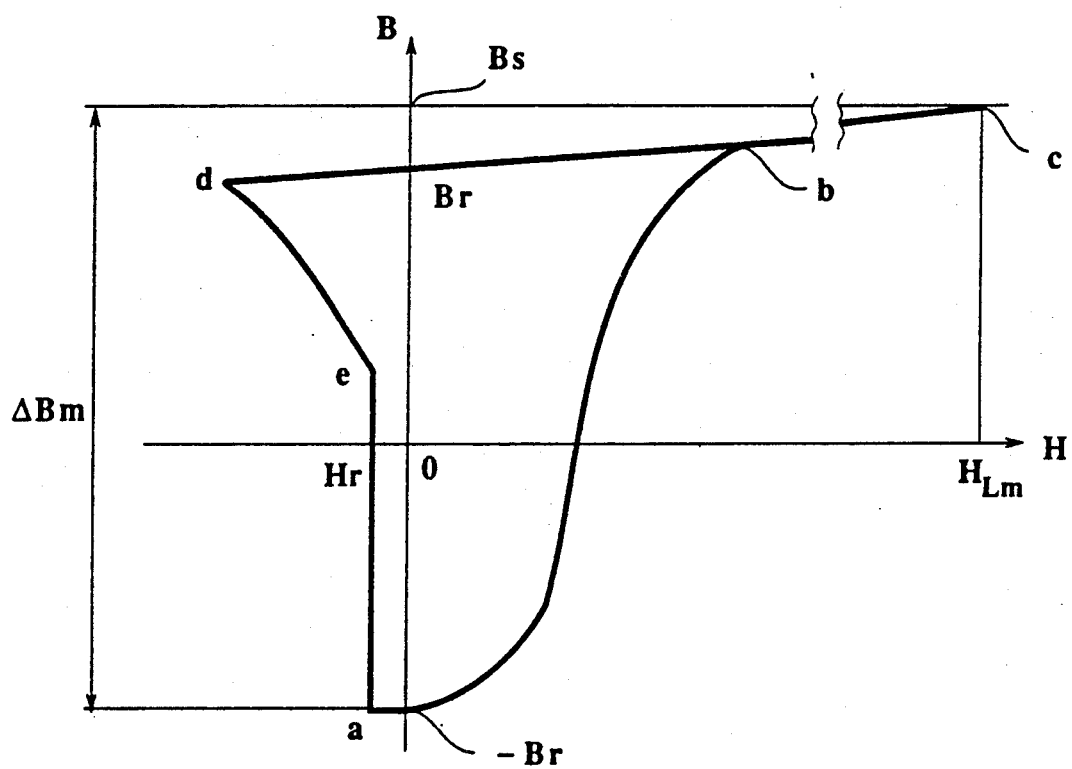
FIG. 9 is a graph schematically showing the operating magnetization curve of a saturable reactor.
Figure 10A:
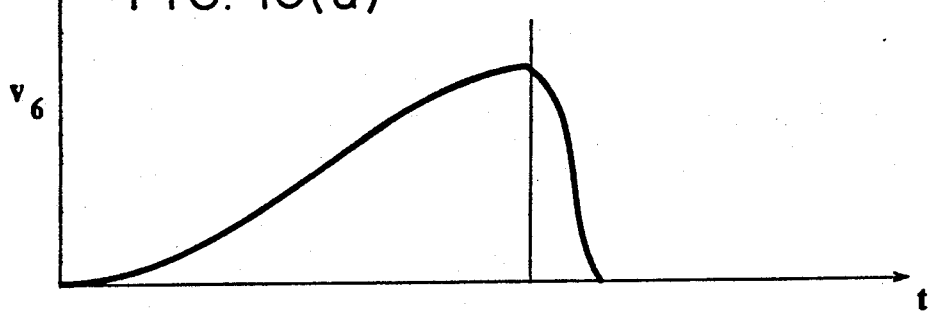
FIGS. 10 (a)-(e) are graphs showing waveforms of current and voltage in various elements in FIGS. 1-3 when input voltage is optimized in FIG. 4.
Figure 10B:
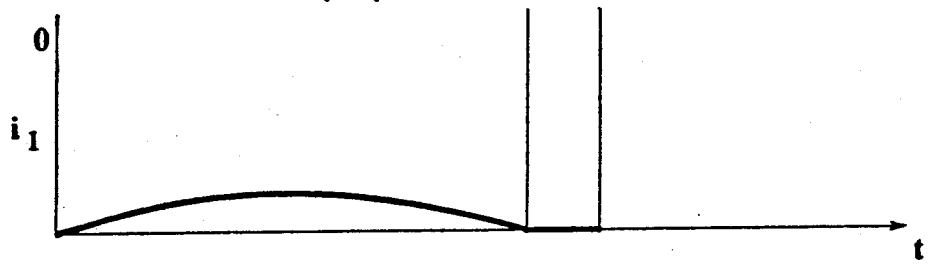
Figure 10C:
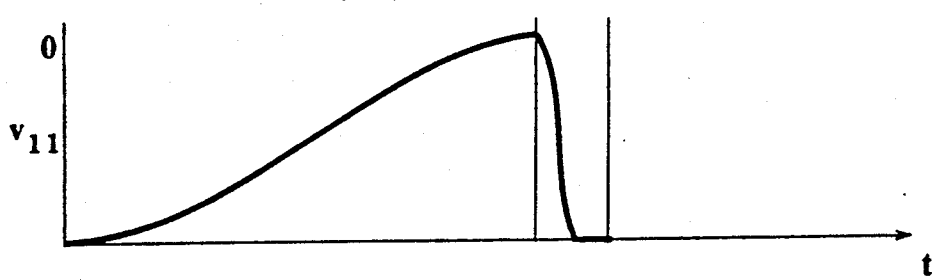
Figure 10D:
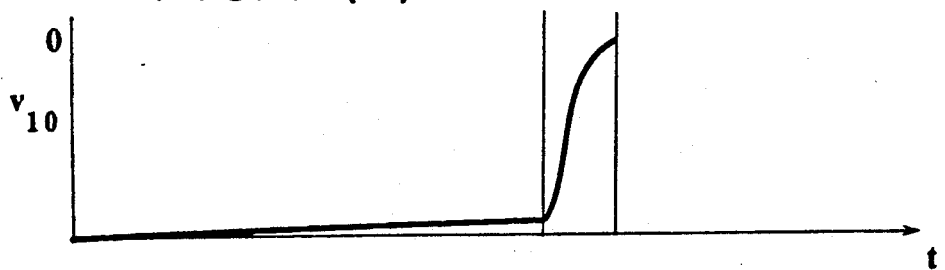
Figure 10E:
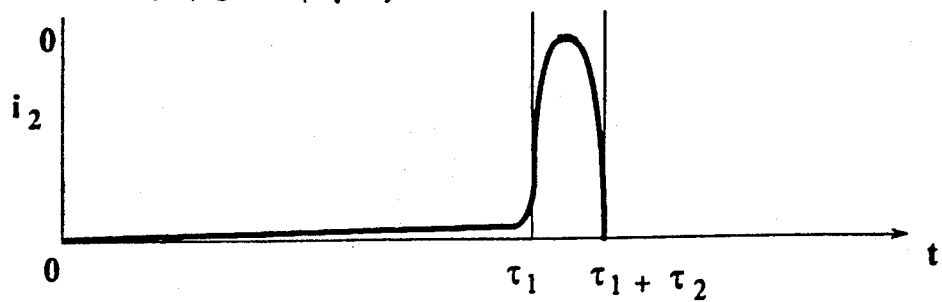
Figure 11A:
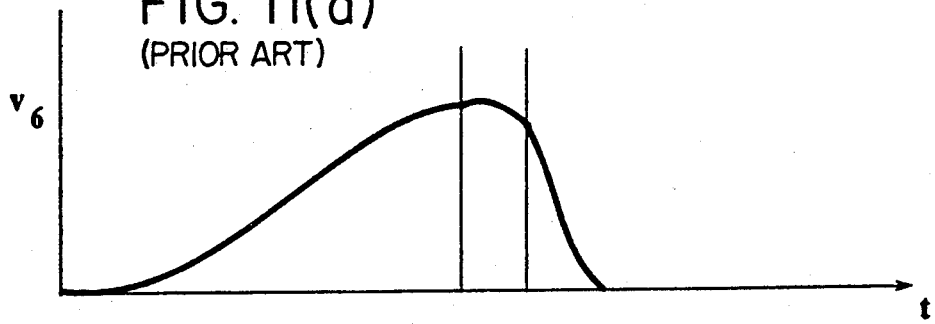
FIGS. 11 (a)-(e) are graphs showing waveforms of current and voltage in various elements in FIG. 4 when input dc power supply voltage is lower than an optimum value.
Figure 11B:
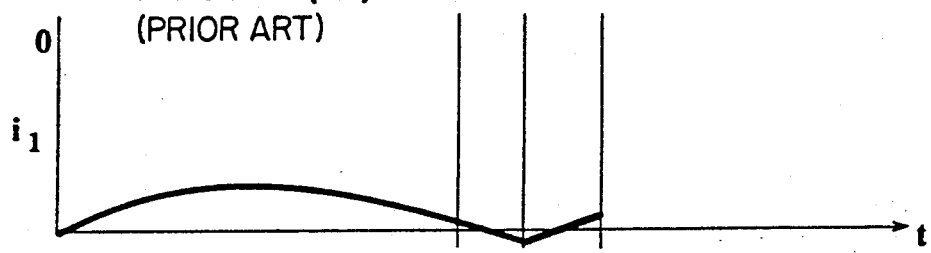
Figure 11C:
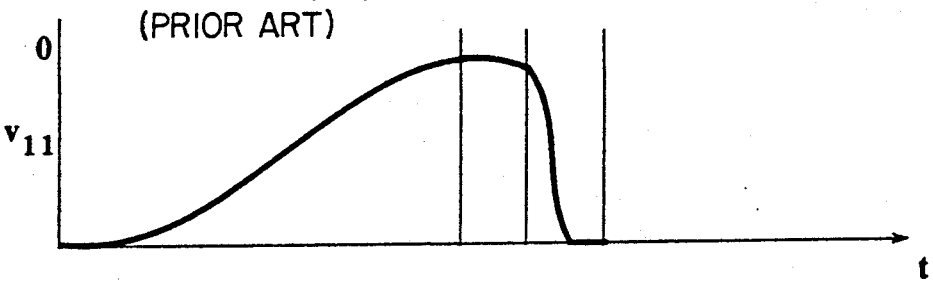
Figure 11D:
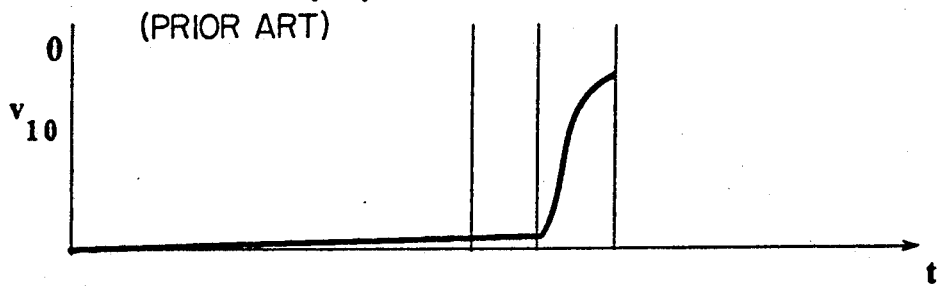
Figure 11E:
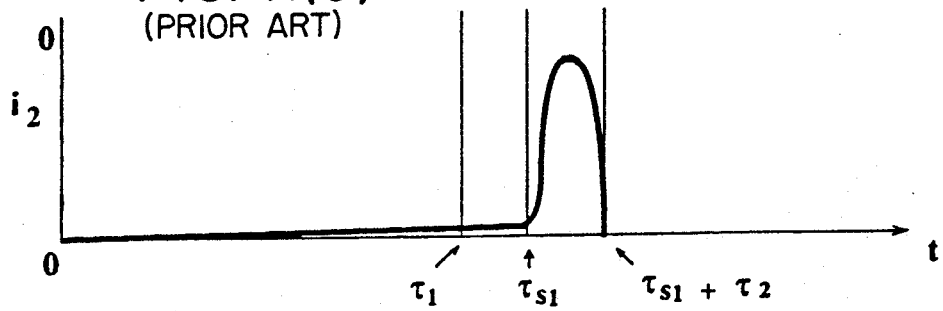
Figure 12A:
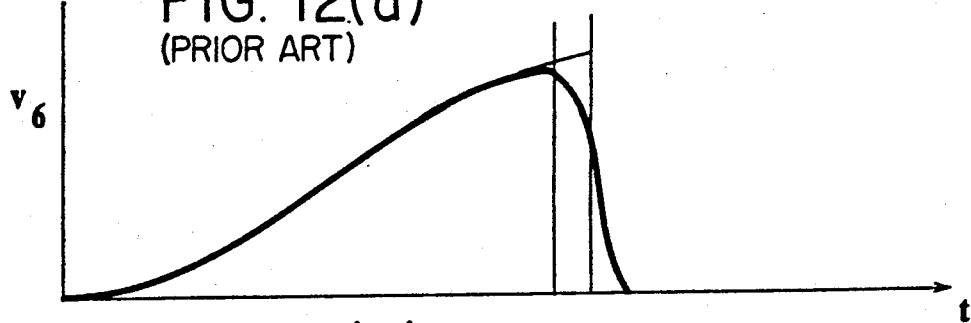
FIGS. 12 (a)-(e) are graphs showing waveforms of current and voltage in various elements in FIG. 4 when input dc power supply voltage is higher than an optimum value.
Figure 12B:
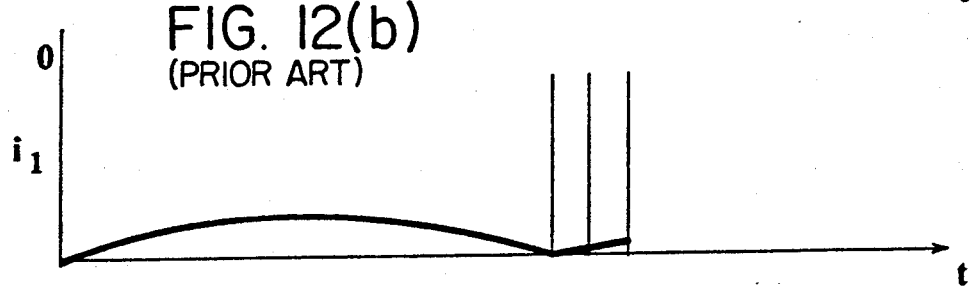
Figure 12C:
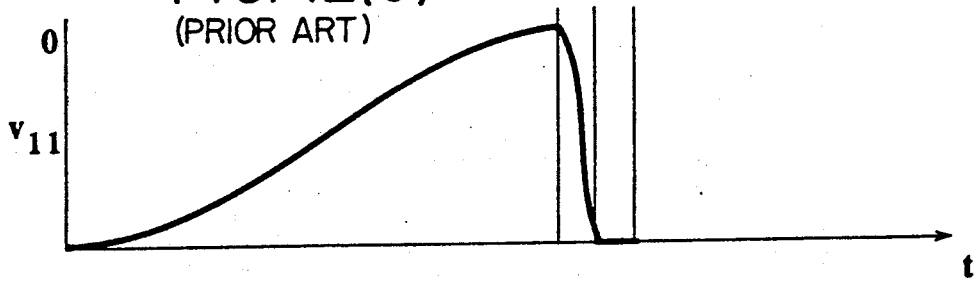
Figure 12D:
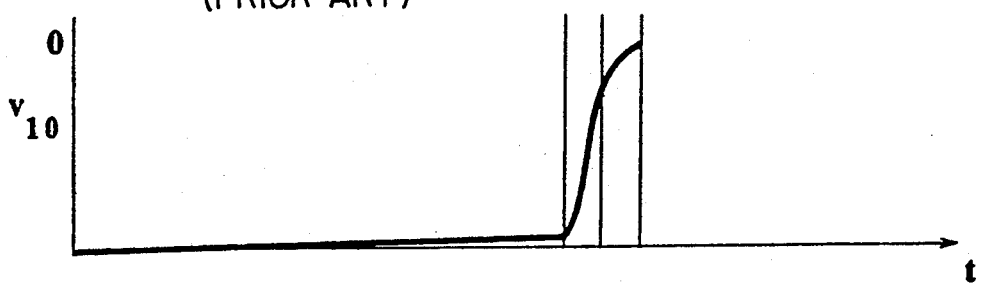
Figure 12E:
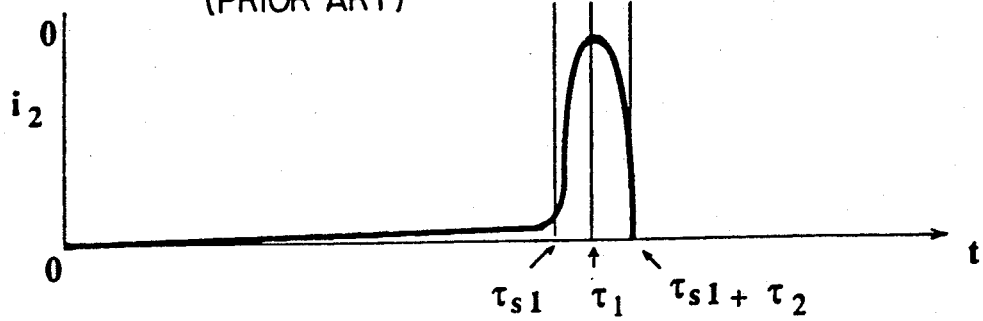
Figure 13A:
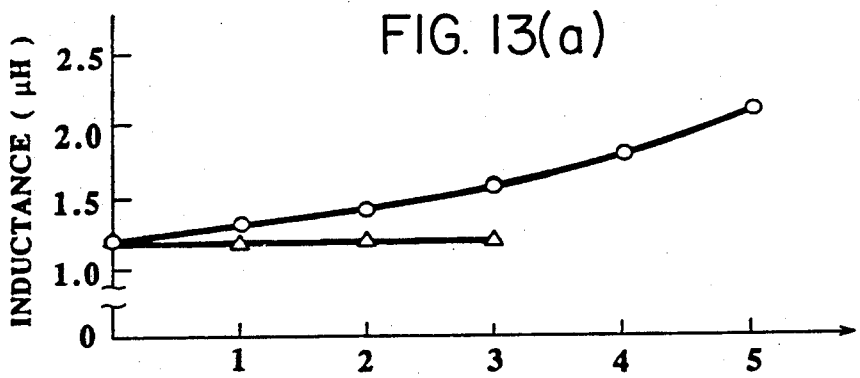
FIG. 13 (a) is a graph showing the relation between inductance and number of shots.
Figure 13B:
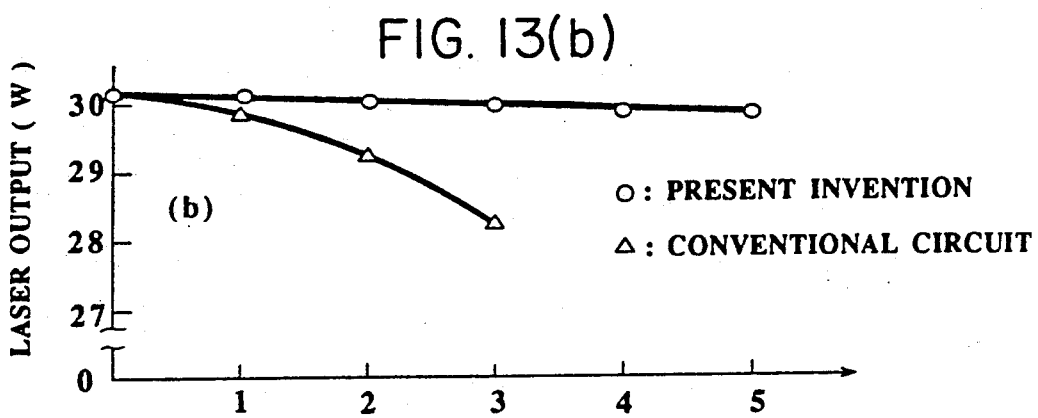
Figure 13C:
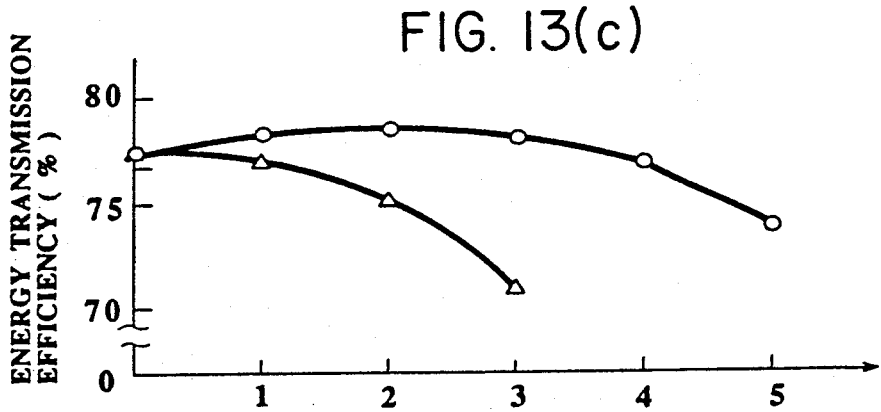
Figure 13D:
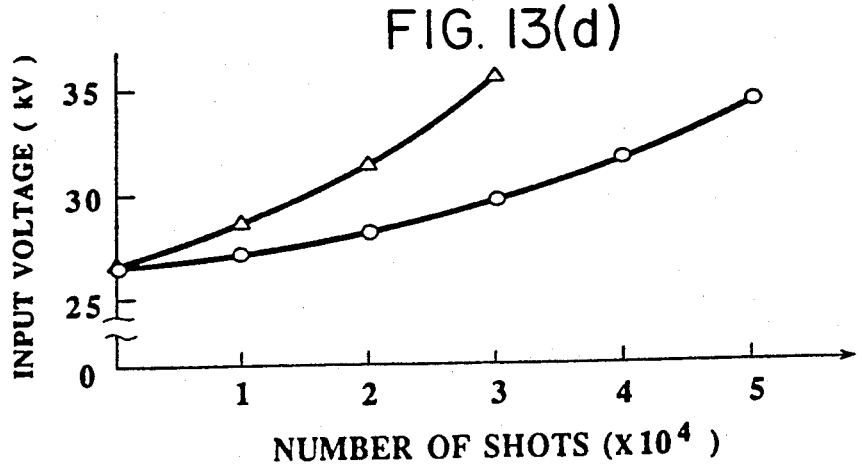

The variable inductor 20 in this circuit has an inductance which enables the optimum operation depending upon the input dc power supply voltage. In this embodiment, the variable inductor 20 is constituted by a circular-shaped solenoid as shown in FIG. 8. In FIG. 8, 51 denotes a coil, and 52 a guide along which the coil 51 is expandable. The inductance of the coil 51 can be decreased by expanding the coil 51 from a state (a) to a state (b) in FIG. 8.

The circuit of this embodiment is also excellent in laser output stability and energy transmission efficiency as compared with a discharge-excited laser comprising the conventional high-voltage pulse generating circuit comprising a voltage doubler circuit and a magnetic pulse compression circuit.

As described above in detail, the high-voltage pulse generating circuit according to the present invention comprises a magnetic pulse compression circuit having a saturable reactor and a variable inductor provided on the input side of the magnetic pulse compression circuit for controlling the pulse width of voltage pulse applied to the saturable reactor. Accordingly, even though the input dc power supply voltage, the operating magnetic flux density of the saturable reactor, etc. vary, the energy transmission efficiency can be kept at an optimum level.

Therefore, in discharge-excited lasers requiring a constant output control due to the deterioration of a laser gas, such as excimer lasers, the laser output does not drop drastically due to the deterioration of a laser gas, even though the input dc power supply voltage increases. Thus, a constant operation can be achieved at remarkably increased number of shots with high reliability and long service life.

In addition, in discharge-excited lasers such as copper vapor lasers used for uranium enrichment, TEMA (transversely excited multi-atmospheric pressure)-$CO_2$, lasers, etc., or accelerators such as linear induction accelerators, in which a plurality of high-voltage pulse generating circuits are operated synchronously at a high pulse-repetition rate, the operation of each high-voltage pulse generating circuit should be conducted synchronously. According to the present invention, the variable inductor can easily control the timing of each high-voltage pulse generating circuit, so that a system comprising a plurality of high-voltage pulse generating circuits operated synchronously can be put to practical use.

Further, in cases where semiconductor elements such as thyristors are used as switching elements in place of discharge elements such as thyratrons, etc., or in cases where linear induction accelerators providing large outputs are used, multistage magnetic pulse compression circuits should be used. In such cases, the optimum operation of a magnetic pulse compression circuit in each stage should be achieved. According to the present invention, the optimum operation can be easily achieved by using a variable inductor.

What is claimed is:

1. A high-voltage pulse generating circuit comprising a magnetic pulse compression circuit having a saturable reactor, and a variable inductor having a variable inductance provided on an input side of said saturable reactor for controlling a pulse width of a voltage pulse to be applied to said saturable reactor.

2. The high-voltage pulse generating circuit according to claim 1, further comprising a controlling means for changing the inductance of said variable inductor depending on input dc power supply voltage supplied to said high-voltage pulse generating circuit.

3. A discharge-excited laser comprising a high-voltage pulse generating circuit which comprises a magnetic pulse compression circuit having a saturable reactor, and a variable inductor having a variable inductance provided on an input side of said saturable reactor for controlling a pulse width of a voltage pulse to be applied to said saturable reactor.

4. The discharge-excited laser according to claim 3, wherein said high-voltage pulse generating circuit further comprises a controlling means for changing the inductance of said variable inductor depending on input dc power supply voltage supplied to said high-voltage pulse generating circuit.

5. An accelerator comprising a high-voltage pulse generating circuit which comprises a magnetic pulse compression circuit having a saturable reactor, and a variable inductor having a variable inductance provided on an input side of said saturable reactor for controlling a pulse width of a voltage pulse to be applied to said saturable reactor.

6. The accelerator according to claim 5, wherein said high-voltage pulse generating circuit further comprises a controlling means for changing the inductance of said variable inductance depending on input dc power supply voltage supplied to said high-voltage pulse generating circuit.

* * * * *